(12) United States Patent
Nakamura et al.

(10) Patent No.: US 6,821,805 B1
(45) Date of Patent: Nov. 23, 2004

(54) SEMICONDUCTOR DEVICE, SEMICONDUCTOR SUBSTRATE, AND MANUFACTURE METHOD

(75) Inventors: Shinji Nakamura, Osaka (JP); Masahiro Ishida, Osaka (JP); Kenji Orita, Osaka (JP); Osamu Imafuji, Osaka (JP); Masaaki Yuri, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/680,054

(22) Filed: Oct. 5, 2000

(30) Foreign Application Priority Data

Oct. 6, 1999 (JP) .......................................... 11-285582

(51) Int. Cl.[7] .............................................. H01L 21/00

(52) U.S. Cl. ............................................ 438/41; 438/44

(58) Field of Search ........................ 438/22, 41, 42–43, 438/47, 46, 49, 44, 973, 974; 257/14, 77, 80, 79, 85, 95, 103, 104, E33.003, E33.028, E33.063; 117/952

(56) References Cited

U.S. PATENT DOCUMENTS

| | | | |
|---|---|---|---|
| 5,122,223 A | | 6/1992 | Geis et al. |
| 6,319,742 B1 | * | 11/2001 | Hayashi et al. .............. 117/952 |
| 6,323,053 B1 | * | 11/2001 | Nishikawa et al. ........... 438/46 |
| 6,325,850 B1 | * | 12/2001 | Beaumont et al. ............ 117/95 |
| 6,326,638 B1 | * | 12/2001 | Kamiyama et al. .......... 257/103 |
| 6,335,546 B1 | * | 1/2002 | Tsuda et al. ................... 257/94 |
| 6,337,223 B1 | * | 1/2002 | Kim et al. ...................... 438/42 |
| 6,355,541 B1 | * | 3/2002 | Holland et al. .............. 438/459 |
| 6,362,016 B1 | * | 3/2002 | Funato et al. ................... 257/79 |
| 6,468,347 B1 | | 10/2002 | Motoki et al. |

FOREIGN PATENT DOCUMENTS

| | | | | |
|---|---|---|---|---|
| CN | 1289865 | | 4/2001 | |
| EP | 0 993 048 A2 | | 4/2000 | |
| JP | 08-255932 | | 10/1996 | |
| JP | 9-027612 | | 1/1997 | |
| JP | 09-167739 | | 6/1997 | |
| JP | 09199419 A | * | 7/1997 | ........... H01L/21/20 |
| JP | 10-312971 | | 11/1998 | |
| JP | 11-312825 | | 11/1999 | |
| JP | 11-340508 | | 12/1999 | |
| JP | 2000-021789 | | 1/2000 | |
| JP | 2000-114178 | | 4/2000 | |
| JP | 2000-124142 | | 4/2000 | |
| JP | 2000-156524 | | 6/2000 | |
| JP | 2000223417 A | * | 8/2000 | ......... H01L/21/205 |

OTHER PUBLICATIONS

Growth mechanism of GaN on sapphire with AlN buffer by MOVPE, Journal of Crystal Growth, 115, pp 628–633 (1991).*

Yu et al., Study of the epitaxial–lateral–overgrowth (ELO) process for GaN on sapphire, Journal of Crystal Growth, 195 pp 333–339 (1998).*

S. Tomioka et al., "GaN Substrates with a Low Dislocation Density Grown by HVPE" In Extended Abstracts (The 61st Autumn Meeting, 2000), Sep. 3, 2000, Section 5p–Y–17, Japan Society of Applied Physics, Catalog No. AP001130–01.

* cited by examiner

Primary Examiner—George Fourson
Assistant Examiner—Brook Kebede
(74) Attorney, Agent, or Firm—Donald P. Studebaker; Nixon Peabody, LLP

(57) ABSTRACT

Disclosed is a semiconductor device which comprises a substrate in which surface is formed a depression having a closed figure when viewed from the substrate normal and a semiconductor layer which is formed on the surface of the substrate by crystal growth from at least an inside face of the depression.

29 Claims, 14 Drawing Sheets

SEMICONDUCTOR DEVICE, SEMICONDUCTOR SUBSTRATE, AND MANUFACTURE METHOD

BACKGROUND OF THE INVENTION

The present invention relates to semiconductor devices, to semiconductor substrates, and to their manufacture methods. The present invention more particularly pertains to a semiconductor device including a lattice defect-suppressed, Group III nitride semiconductor layer.

In recent years, intensive research and development of blue semiconductor laser elements, high-speed operation transistors, et cetera employing Group III nitride semiconductor materials (for example, GaN-based compound semiconductor materials), have been conducted. FIG. 18 shows in cross section the structure of a conventional semiconductor device including a Group III nitride semiconductor layer. In order to provide clear viewing of the structure, the cross section is represented with no hatching drawn therein.

The semiconductor device (FIG. 18) is a semiconductor laser element that comprises nitride semiconductor. In this semiconductor device, a GaN buffer layer 2, an n-type GaN layer 3, an n-type AlGaN clad layer 4, an n-type GaN light guide layer 5, an undope InGaN active layer 6, a p-type GaN light guide layer 7, a first p-type AlGaN clad layer 8, a current constriction layer 10 with an opening 9, a second p-type AlGaN clad layer 11, and a p-type GaN contact layer 12 are formed sequentially in that order on a sapphire substrate 1. Attached to an exposed surface area of the n-type GaN layer 3 is an n-type electrode 13. On the other hand, a p-type electrode 14 is attached to the p-type GaN contact layer 12. The buffer layer 2 is for the reduction of lattice mismatching between the sapphire substrate 1 and the n-type GaN layer 3, thereby to facilitate crystal growth. Accordingly, the buffer layer 2 has no direct influence on the operation of the semiconductor element.

The undope InGaN active layer 6 of the semiconductor device comprises nitride semiconductor. Because of this, application of a given voltage to the n- and p-type electrodes 13 and 14 enables the semiconductor device to act as a laser element capable of oscillation of blue light. However, in this conventional semiconductor device, there exists a lattice defect 15 in the form of a stripe within the n-type GaN layer 3 (FIG. 18). With the crystal growth of the n-type GaN layer 3, the n-type AlGaN clad layer 4, etc., the lattice defect 15 extends upwardly. This results in the existence of the lattice defect 15 (e.g., threading dislocation) in the opening 9 of the current constriction layer 10 in the undope InGaN active layer 6 which functions as an active region of the semiconductor laser element.

For the case of semiconductor devices in need of high current injection such as semiconductor laser elements, if the lattice defect 15 exists, deterioration starts from a portion of the lattice defect 15. Such deterioration will considerably reduce the life span and the reliability of semiconductor devices. Not only in the active layer of the semiconductor laser element of FIG. 18, but also in the gate region of the semiconductor transistor element which operates at high speed, the existence of a lattice defect causes problems. That is, if there exists a lattice defect in a gate region, this results in the drop in carrier mobility, and the performance of the semiconductor transistor element drops. As described above, if there exists a lattice defect in an area that functions as the active region of the semiconductor element (e.g., an active layer of the semiconductor laser element or a transistor gate region), this results in deterioration in semiconductor element performance.

Recently, various techniques for obtaining a lattice defect-suppressed, nitride semiconductor layer have been proposed. For example, in one such technique, an $SiO_2$ mask layer with an opening is formed atop a sapphire substrate. This is followed by lateral growth of a GaN layer by CVD (for example, MOCVD) to obtain a nitride semiconductor layer with a reduced lattice defect density (see JP Kokai Publication No. H11-312825, JP Kokai Publication No. H11-340508, and JP Kokai Publication No. 2000-21789). Further, the present applicant proposed another technique (for example, see JP Kokai Publication No. 2000-156524), in which a GaN layer, whose surface is indented in the form of, for example, a stripe-like groove, is formed on a sapphire substrate and a nitride semiconductor layer is deposited on the sapphire substrate, for obtaining a nitride semiconductor layer with a reduced lattice defect density.

The former technique making use of an $SiO_2$ mask layer can provide a lattice defect-suppressed nitride semiconductor layer but suffers the problem that the $SiO_2$ mask layer remains within the semiconductor device. The $SiO_2$ mask layer is lower in heat transfer rate than the nitride semiconductor layer, so that if the $SiO_2$ mask layer is left in the semiconductor device, the semiconductor device becomes poor in heat radiation, and the reliability of the semiconductor device drops. Further, in addition to the step of forming a nitride semiconductor layer, another step of forming an $SiO_2$ mask layer is required. The manufacture process becomes complicated. On the other hand, the latter technique proposed by the present applicant can avoid, for example, the problem of poor heat radiation, for it does not use an $SiO_2$ mask. However, when a stripe-like groove is used to suppress lattice defects, the latter technique has difficulty in doing so in a direction along the stripe direction.

Bearing in mind the above-described points, the present invention was made. Accordingly, a major object of the present invention is to provide a semiconductor device, and a semiconductor substrate and its manufacture method for reduction in the lattice defect density.

SUMMARY OF THE INVENTION

The present invention provides a semiconductor device which comprises a substrate in which surface is formed a depression having a closed figure when viewed from the substrate normal and a semiconductor layer which is formed on the surface of the substrate by crystal growth from at least an inside face of the depression.

Preferably, the depression includes at least two adjacent inside faces unparallel to the surface of the substrate and an angle, formed by two line segments created by intersecting of the two inside faces and a plane parallel to the surface of the substrate, is either 60 degrees or 120 degrees.

In an embodiment of the present invention, the figure of the-depression is either substantially an equilateral triangle or substantially an equilateral hexagon.

Preferably, the substrate comprises a semiconductor layer having a hexagonal crystal structure and the depression is formed in a surface of the aforesaid semiconductor layer.

Preferably, the semiconductor layer constituting the substrate and the semiconductor layer formed on the surface of the substrate each comprise nitride semiconductor.

Preferably, the inside face of the depression is either a plane having a plane orientation of (1, −1, 0, n) where the number n is an arbitrary number, or its equivalent plane.

In an embodiment of the present invention, the number n is 1.

Preferably, a plurality of the depressions are formed in the surface of the substrate.

Preferably, a plurality of semiconductor layers including at least an active layer are formed on the substrate.

The present invention provides another semiconductor device which comprises a substrate on which surface is formed a projection and a semiconductor layer which is formed on the surface of the substrate by crystal growth from at least a side face of the projection wherein the projection includes at least two adjacent side faces unparallel to the surface of the substrate and wherein an angle, formed by two line segments created by intersecting of the two side faces and a plane parallel to the surface of the substrate, is either 60 degrees or 120 degrees.

Preferably, the substrate comprises a semiconductor layer having a hexagonal crystal structure and the projection is formed on a surface of the aforesaid semiconductor layer.

Preferably, the semiconductor layer constituting the substrate and the semiconductor layer formed on the surface of the substrate each comprise nitride semiconductor.

Preferably, the side face of the projection is either a plane having a plane orientation of (1, −1, 0, n) where the number n is an arbitrary number, or its equivalent plane.

In an embodiment of the present invention, the number n is 1.

Preferably, a plurality of the projections are formed on the surface of the substrate.

Preferably, a plurality of semiconductor layers including at least an active layer are formed on the substrate.

The present invention provides a method for the manufacture of a semiconductor device, the method comprising a step of preparing a substrate in which surface is formed a depression having a closed figure when viewed from the substrate normal; and a step of forming on the surface of the substrate a semiconductor layer having a hexagonal crystal structure.

The present invention provides a method for the manufacture of a semiconductor device, the method comprising a step of preparing a substrate, a step of forming on a surface of the substrate a depression having a closed figure when viewed from the substrate normal, and a step of forming on the surface of the substrate a semiconductor layer having a hexagonal crystal structure.

Preferably, the depression forming step is performed such that an inside face of the depression is defined by either a plane having a plane orientation of (1, −1, 0, 1) or its equivalent plane.

Preferably, the depression forming step is the step of forming on the major surface of the substrate defined by a (0, 0, 0, 1) plane a depression having a bottom face whose figure is either an equilateral triangle or an equilateral hexagon.

Preferably, the semiconductor layer forming step is the step of forming a semiconductor layer in which an inside face of the depression serves as a crystal growth surface.

Preferably, the semiconductor layer forming step includes a step in which the semiconductor layer crystal grows in a vertical direction from the inside face of the depression.

Preferably, the semiconductor layer forming step is the step of forming a semiconductor layer in which an inside face of the depression serves as a crystal growth surface.

Preferably, the semiconductor layer forming step includes a step in which the semiconductor layer crystal grows in a vertical direction from the inside face of the depression.

In an embodiment of the present invention, the semiconductor layer forming step is the step of forming a layer which comprises Group III nitride-based compound semiconductor.

In another embodiment of the semiconductor layer forming step is the step of forming a layer which comprises Group III nitride-based compound semiconductor.

In an embodiment of the present invention, the Group III nitride-based compound semiconductor layer is grown by a metal organic vapor epitaxy method.

In another embodiment of the present invention, the Group III nitride-based compound semiconductor layer is grown by a metal organic vapor epitaxy method.

Preferably, the substrate preparing step is the step of preparing a sapphire substrate on which surface is formed a Group III nitride-based compound semiconductor layer and the depression forming step is the step of forming the depression in a surface of the Group III nitride-based compound semiconductor layer.

The present invention provides a semiconductor substrate which comprises a substrate in which surface is formed a depression having a closed figure when viewed from the substrate normal and a semiconductor layer which is formed on the surface of the substrate by crystal growth from at least an inside face of the depression.

Preferably, the depression includes at least two adjacent inside faces unparallel to the surface of the substrate and an angle, formed by two line segments created by intersecting of the two inside faces and a plane parallel to the surface of the substrate, is either 60 degrees or 120 degrees.

In an embodiment of the present invention, the figure of the depression is either substantially an equilateral triangle or substantially an equilateral hexagon.

Preferably, the substrate comprises a semiconductor layer having a hexagonal crystal structure and the depression is formed in a surface of the semiconductor layer.

Preferably, the semiconductor layer constituting the substrate and the semiconductor layer formed on the surface of the substrate each comprise nitride semiconductor.

Preferably, the inside face of the depression is either a plane having a plane orientation of (1, −1, 0, n) where the number n is an arbitrary number, or its equivalent plane. In an embodiment of the present invention, the number n is 1.

Preferably, a plurality of the depressions are formed in the surface of the substrate.

The present invention provides a semiconductor substrate which comprises a substrate on which surface is formed a projection and a semiconductor layer which is formed on the surface of the substrate by crystal growth from at least a side face of the projection, wherein the projection includes at least two adjacent side faces unparallel to the surface of the substrate and wherein an angle, formed by two line segments created by intersecting of the two side faces and a plane parallel to the major surface of the substrate, is either 60 degrees or 120 degrees.

In an embodiment of the present invention, the substrate comprises a semiconductor layer having a hexagonal crystal structure and the projection is formed on a surface of the semiconductor layer.

Preferably, the semiconductor layer constituting the substrate and the semiconductor layer formed on the surface of the substrate each comprise nitride semiconductor.

Preferably, the side face of the projection is either a plane having a plane orientation of (1, −1, 0, n) where the number n is an arbitrary number, or its equivalent plane.

In an embodiment of the present invention, the number n is 1.

Preferably, a plurality of the projections are formed on the surface of the substrate.

The present invention provides a method for the manufacture of a semiconductor substrate, the method including a step of preparing a substrate for crystal growth, a step of depositing on the crystal growth substrate a first semiconductor layer having a hexagonal crystal structure, a step of exposing either a plane having a plane orientation of (1, −1, 0, n) where the number n is an arbitrary number, or its equivalent plane by subjecting a part of the first semiconductor layer to an etching process, and after the exposing step, a step of depositing on the first semiconductor layer a second semiconductor layer having a hexagonal crystal structure.

Preferably, the exposing step includes a step of applying onto the first semiconductor layer a resist pattern having an opening whose figure is either substantially an equilateral triangle, or substantially an equilateral hexagon when viewed from the substrate normal, and a step of forming a depression by subjecting the first semiconductor layer to an etching process in which the resist pattern is used as a mask so that the depression has an inside face comprising either a plane having a plane orientation of (1, −1, 0, n) where the number n is an arbitrary number, or its equivalent plane.

Preferably, the resist pattern has a plurality of the openings arrayed at equal intervals.

Preferably, the exposing step includes a step of applying onto the first semiconductor layer a resist pattern whose figure is either substantially an equilateral triangle, or substantially an equilateral hexagon when viewed from the substrate normal, and a step of forming a projection by subjecting the first semiconductor layer to an etching process in which the resist pattern is used as a mask so that the projection has a side face comprising either a plane having a plane orientation of (1, −1, 0, n) where the number n is an arbitrary number or its equivalent plane.

Preferably, the resist pattern comprises a plurality of the resist patterns arrayed at equal intervals.

The present invention provides a method for the manufacture of a semiconductor substrate, the method comprising a step of forming a substrate having on a surface thereof a depression having a closed figure when viewed from the substrate normal, a step of forming on the surface of the substrate a semiconductor layer having a hexagonal crystal structure, and a step of taking out the semiconductor layer by removal of the substrate.

Preferably, the depression has an inside face defined by either a plane having a plane orientation of (1, −1, 0, 1) or its equivalent plane.

Preferably, the depression has, in the major surface of the substrate defined by a (0, 0, 0, 1) plane, a bottom face whose figure is either an equilateral triangle or an equilateral hexagon.

The present invention provides a method for the manufacture of a semiconductor substrate, the method comprising a step of forming a substrate having on a surface thereof a projection, a step of forming on the surface of the substrate a semiconductor layer having a hexagonal crystal structure, and a step of taking out the semiconductor layer by removal of the substrate.

Preferably, the projection has a side face defined by either a plane having a plane orientation of (1, −1, 0, 1) or its equivalent plane.

Preferably, the projection has, in the major surface of the substrate defined by a (0, 0, 0, 1) plane, a bottom face whose figure is either an equilateral triangle or an equilateral hexagon.

In an embodiment of the present invention, the semiconductor layer forming step is the step of forming a layer of Group III nitride-based compound semiconductor.

In another embodiment of the present invention, the semiconductor layer forming step is the step of forming a layer of Group III nitride-based compound semiconductor.

In an embodiment of the present invention, the Group III nitride-based compound semiconductor layer is grown by hydride vapor phase epitaxy.

In another embodiment of the present invention, the Group III nitride-based compound semiconductor layer is grown by hydride vapor phase epitaxy.

Preferably, the substrate forming step includes a step of preparing a sapphire substrate and a step of forming on the sapphire substrate a Group III nitride-based compound semiconductor layer having the depression in a surface thereof.

Preferably, the substrate forming step includes a step of preparing a sapphire substrate and a step of forming on the sapphire substrate a Group III nitride-based compound semiconductor layer having the projection on a surface thereof.

PREFERRED EMBODIMENTS OF THE PRESENT INVENTION

Embodiments of the present invention will be described by making reference to the drawings. The present invention is not limited to these embodiments.

Embodiment 1

Figure 1:
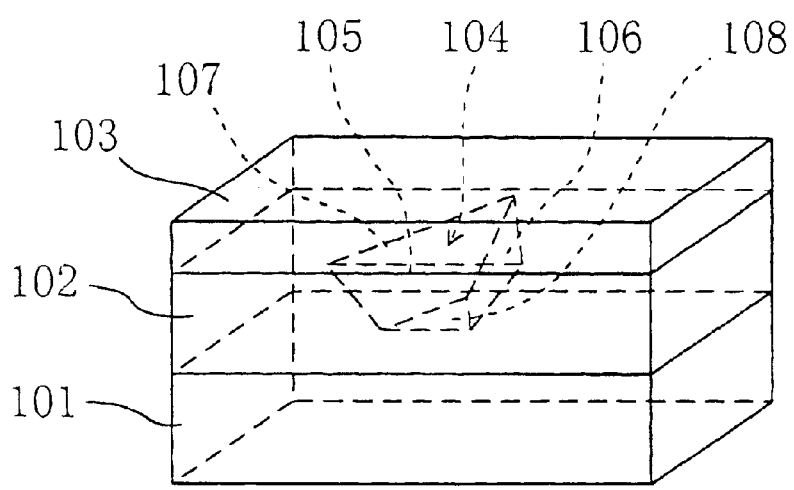
FIG. 1 is a diagram for the explanation of the structure of a semiconductor device according to a first embodiment of the present invention.

Referring to FIGS. 1–6, a first embodiment of the present invention will be described. FIG. 1 schematically shows the structure of a semiconductor device according to the first embodiment. The semiconductor device (FIG. 1) comprises a substrate 102 in which surface is formed a depression 104 having a closed figure when viewed from the substrate normal and a semiconductor layer 103 which is formed on a surface of the substrate 102 by crystal growth from inside faces (105, 106, 107) of the depression 104. Since the semiconductor layer 103 is formed by crystal growth from the inside faces (105, 106, 107), this causes defects (i.e., lattice defects) in the semiconductor layer 103 to concentrate in the direction of the center of the depression 104. That is to say, since the semiconductor layer 103 crystal grows in a direction different from the normal direction of the substrate 102 (for example, in a direction perpendicular to an inside face of the depression 104), this causes defects of the semiconductor layer 103 to collect. Therefore, the semiconductor layer 103 comes to have a reduced defect density. If the semiconductor layer 103 with a reduced defect density serves as the semiconductor element active region (e.g., the active layer of the semiconductor laser element and the gate region of the semiconductor transistor element), this provides a semiconductor device (such as a semiconductor laser device and a semiconductor integrated circuit device) superior in reliability and high in performance. In FIG. 1, actual elements making up of the semiconductor device are not shown; however, such elements can be prepared using technology known in the art.

The depression (or the concave portion) 104 of the present embodiment comprises the inside faces 105, 106, and 107 adjacent to each other. The inside faces 105, 106, and 107 are not parallel to the surface (major surface) of the substrate 102 and the angle, formed by two line segments created by intersecting of two of the three inside faces 105, 106, and 107 and the surface of the substrate 102, is 60 degrees. The angle of 60 degrees improves the crystallinity of the inside faces 105, 106, and 10.7 to improve the crystallinity of the semiconductor layer 103 that is formed on the substrate 102. As can be seen from FIG. 1, when viewed from the substrate normal, the figure of the depression 104 is an equilateral triangle. Since the surface (major surface) of the substrate 102 is a flat surface, the three angles of the triangle which defines the outline of the depression 104 on the major surface of the substrate 102 are all equal to 60 degrees.

The substrate 102, in which the depression 104 is formed, comprises a semiconductor layer having a hexagonal structure. In the present embodiment, the substrate 102 is a first Ad semiconductor layer (also referenced by 102) of hexagonal GaN with a (0, 0, 0, 1) plane as its major surface. The thickness of the first semiconductor layer 102 is 2.0 μm and the depth of the depression 104 of the first semiconductor layer 102 is 1.0 μm. The length of the sides of the equilateral triangle-shaped outline of the depression 104 in the major surface of the first semiconductor layer 102 is 1.5 μm. The inside faces 105, 106, and 107 of the depression 104 have plane orientations (1, −1, 0.1), (0, 1, −1, 1), and (−1, 0, 1, 1), respectively. These plane orientations are equivalent plane orientations in hexagonal structure. The planes having plane orientations including a (1, −1, 0, 1) plane orientation and its equivalent plane orientations are the inside faces (side faces) of the depression 104, thereby improving the crystallinity of the second semiconductor layer 103 which crystal grows from at least the inside faces of the depression 104 to be formed on the first semiconductor layer 102. At the bottom of the depression 104 lies a plane having a (0, 0, 0, 1) plane orientation.

Throughout the specification, "−1" has been used instead of using the "1 bar" representation which is usually employed to indicate plane orientations or crystal orientations. Moreover, the (1, −1, 0, 1) plane orientation and its equivalent plane orientations will be referred generally to as the {1, −1, 0, 1} plane orientation.

In the present embodiment, the first semiconductor layer 102 of GaN is formed on a sapphire substrate 101 for crystal growth and the depression 104 has a bottom face 108 parallel to the upper surface of the sapphire substrate 101. The second semiconductor layer 103 overlying the first semiconductor layer 102 comprises $Al_{0.1}Ga_{0.9}N$. The thickness of the second semiconductor layer 103 is 1.0 μm. Formed between the sapphire substrate 101 and the first semiconductor layer 102 is a buffer layer of undope GaN with a thickness of about 50 nm (not shown in the figure).

In accordance with the present embodiment, the second semiconductor layer 103 is formed by crystal growth from the three side faces 105, 106, and 107 located in the inside of the depression 104 formed in the first semiconductor layer 102. Therefore, the second semiconductor layer 103 makes crystal growth in a direction different from a direction normal to the major surface of the first semiconductor layer 102, thereby causing defects to collect in one area. This makes it possible for the second semiconductor layer 103 overlying the three side faces 105, 106, and 107 to have a reduced defect density.

Figure 2A:
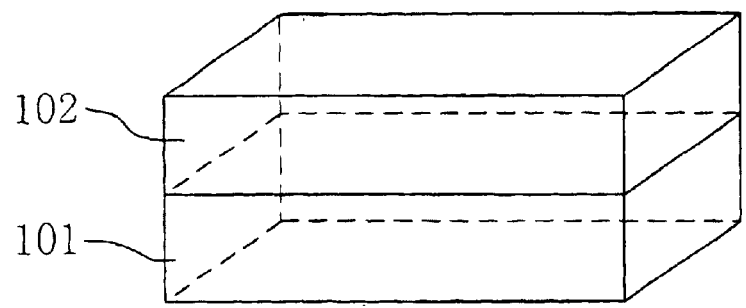
FIGS. 2A–C are views showing process steps for the explanation of a manufacture method according to the first embodiment.
Figure 2B:
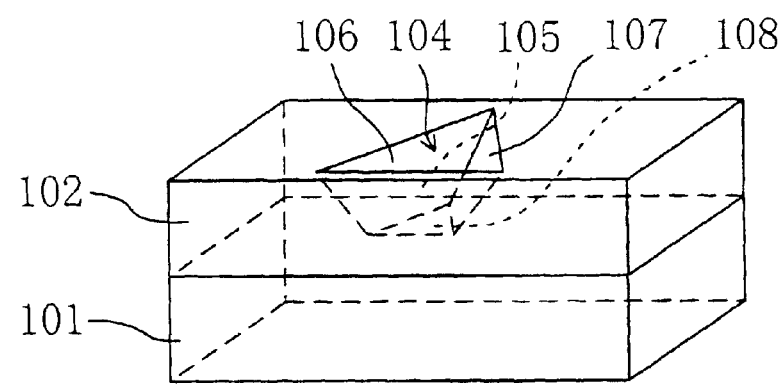
Figure 2C:
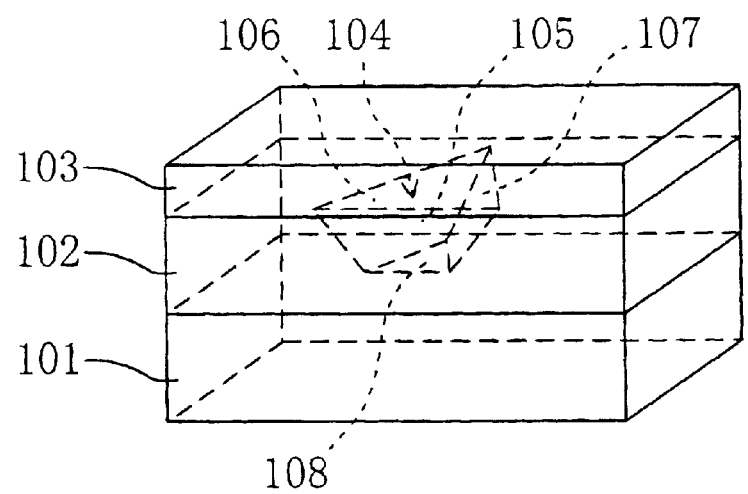

Referring now to FIGS. 2A–C, there is shown a method for the manufacture of a semiconductor device according to the present embodiment.

In the first place, the first semiconductor layer 102 is grown on the sapphire substrate 101 by a metal organic vapor epitaxy (MOVPE) method (FIG. 2A).

Next, a resist pattern (not shown in the figure) with an opening of equilateral triangular shape is applied over the first semiconductor layer 102 (FIG. 2B). Then, dry etching is carried out through the resist pattern serving as a mask. As a result of the dry etching process, the thickness of an area of the first semiconductor layer 102 located within the mask opening, is reduced such that the three side faces 105, 106, and 107 and the bottom face 108 are exposed. As described hereinbefore, the plane orientation of the three side faces 105, 106, and 107 is {1, −1, 0, 1}.

Figure 3A:
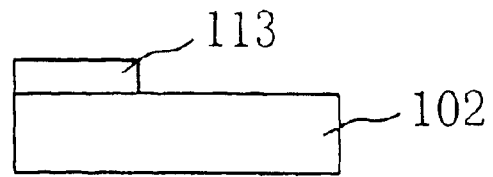
FIGS. 3A and 3B are views showing process steps for the explanation of a manufacture method according to the first embodiment.
Figure 3B:
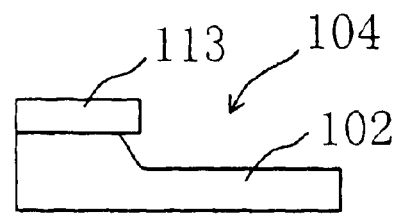
Figure 4:
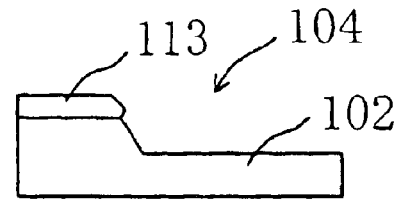
FIG. 4 is a view showing a process step for the explanation of a manufacture method according to the first embodiment.

It will be sufficient that such etching is carried out by, for example, the process steps shown in FIGS. 3A and 3B. First, a resist pattern 113 is formed on the first semiconductor layer 102 (FIG. 3A). Next, as shown in FIG. 3B, side etching is carried out to remove areas of the first semiconductor layer 102 that are not coated with the resist pattern 113, whereby a plane having a plane orientation of {1, −1, 0, 1} is exposed as a side face of the depression 104 (105, 106, or 107). Further, as shown in FIG. 4, the following arrangement may be made. That is, after the resist pattern 113 is formed on the first semiconductor layer 102, etching conditions, under which the resist pattern 113 itself is etched, are chosen to expose a plane having a plane orientation of (1, −1, 0, 1) as a side face of the depression 104 (105, 106, or 107).

Next, after removal of the resist pattern, the second semiconductor layer 103 is grown on the first semiconductor layer 102 by MOVPE (FIG. 2C). Thereafter, a process step of forming active elements of the semiconductor element in the second semiconductor layer 103 is carried out by making utilization of technologies known in the art, thereby to obtain a semiconductor device of the present embodiment. Instead of using MOVPE, other vapor epitaxy methods such as an HVPE (hydride vapor phase epitaxy) method may be useful.

Figure 5A:
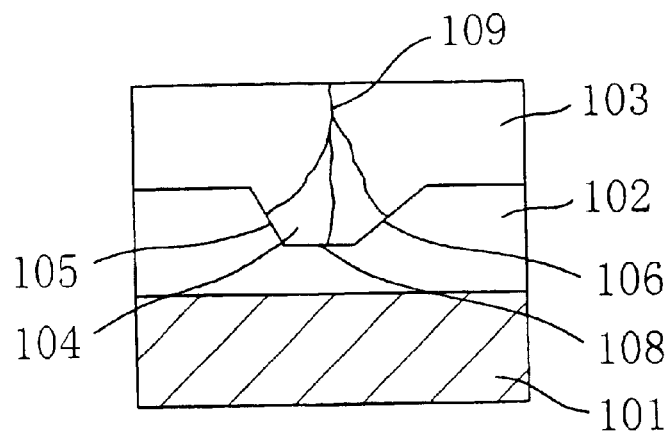
FIGS. 5A–C are cross-sectional views showing results obtained by observation of the cross sectional structure of semiconductor layers 102 and 103 by an electron microscope.
Figure 5B:
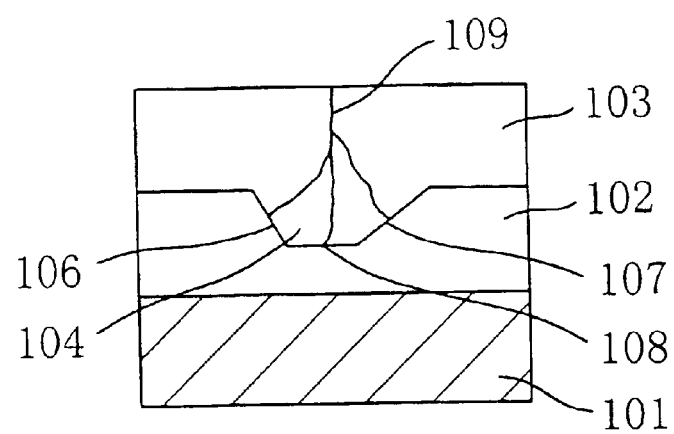
Figure 5C:
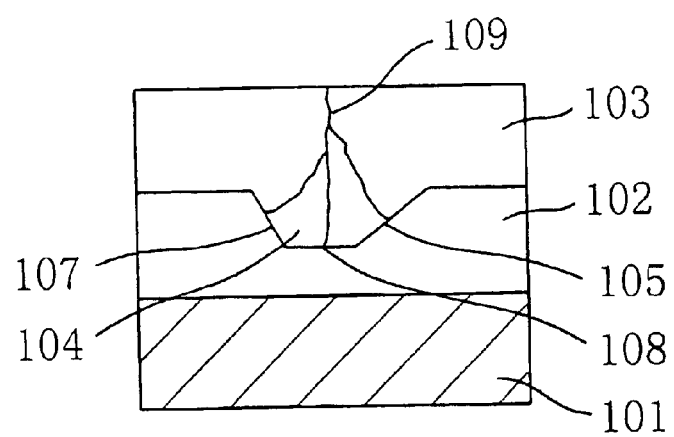

Cross sections of the first and second semiconductor layers 102 and 103 in the present embodiment were observed by an electron microscope and the observation results are shown in FIGS. 5A–C. FIGS. 5A, 5B, and 5C show the manner of cross sections when cut along planes perpendicular to the major surface of the first semiconductor layer. In FIG. 5, there is drawn no hatching for some layers for the sake of convenience.

Each of the cross sections of FIGS. 5A, 5B, and 5C showed a collection of defects 109. The surrounding surface of the depression 104 was observed by an optical microscope and the result showed that the defect 109 appeared in the form of a point in the vicinity of substantially the center of the depression 104 and any other defects were not found.

Figure 6:
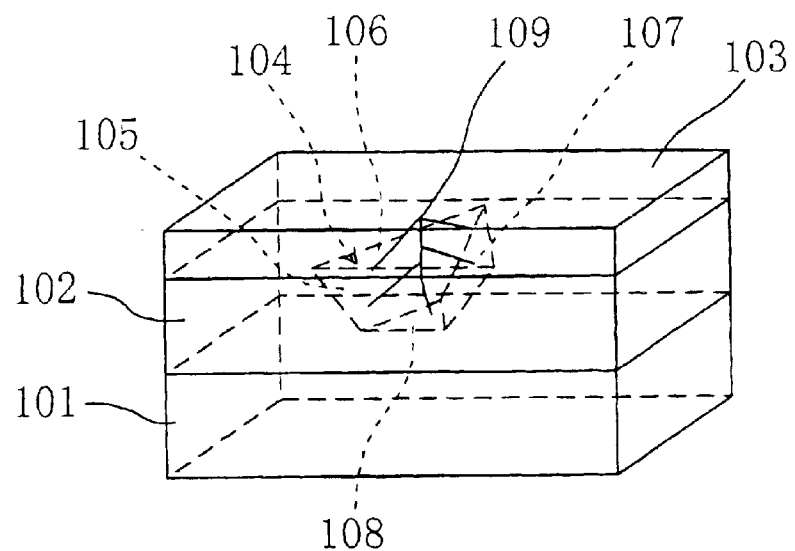
FIG. 6 is a structure diagram illustrating the manner of defects in the semiconductor layer 103.

According to the observation results, the defects 109 in the second semiconductor layer 103 of the present embodiment collected at one area (FIG. 6). In the structure without the provision of the depression 104 in the surface of the first semiconductor layer 102, its defect density ranges from $10^8$ defects per $cm^2$ to $10^{10}$ defects per $cm^2$. On the other hand, in accordance with the structure of the present embodiment, the defect density can be considerably reduced to the range of from $10^6$ defects per $cm^2$ to $10^7$ defects per $cm^2$.

Additionally, in the present embodiment, the depression 104 is formed by etching of the first semiconductor layer 102, so that there is no need for the formation of an $SiO_2$ mask layer which is used in the prior art techniques (such as JP Kokai Publication No. H11-312825). Because of this, problems, such as the problem that the heat radiation property of semiconductor devices becomes poor and the problem that the manufacture process of semiconductor devices becomes complicated, can be avoided.

The following alternations may be made to the structure of the present embodiment described above.

In the present embodiment, the depression 104 is defined by the three side faces 105, 106, and 107 having plane orientations of (1, −1, 0, 1), (0, 1, −1, 1), and (−1, 0, 1, 1), respectively. However, the c-axis component is not limited to 1 and is therefore allowed to have any other arbitrary value. That is to say, an alternation may be made in which the plane orientation of the three side faces 105, 106, and 107 is (1, −1, 0, n) where the number n is an arbitrary number. The reason is as follows. In view of the crystal growth surface of the second semiconductor layer 103, it is preferable for the three side faces 105, 106, and 107 to have a (1, −1, 0, 1) plane orientation; however, a crystal growth surface having a (1, −1, 0, 1) plane orientation is spontaneously formed by crystal growth of the second semiconductor layer 103 even when the c-axis component deviates from 1, and there are some cases in which an ideal {1, −1, 0, 1} plane cannot be obtained due to the manufacture process conditions.

Further, the figure of depression 104 when viewed from the substrate normal is not limited to an equilateral triangle. The figure of the depression 104 may be an equilateral hexagon. That is to say, as long as the figure of the depression 104 is a hexagon, the side faces of the depression 104 can be formed of {1, −1, 0, 1 } planes, and the crystallinity of the side faces can be improved. In other words, since the side faces of the depression 104 can be (1, −1, 0, 1), (−1, 0, 1), (0, 1, −1, 1), (0, −1, 1, 1), (−1, 0, 1, 1), and (1, 0, −1, 1), this makes it possible to improve the crystallinity of the side faces so as to improve the crystallinity of the second semiconductor layer 103 which crystal grows from at least the side faces. In such a case, the six angles of the hexagon that defines the outline of the depression 104 in the major surface of the first semiconductor layer 102 are, of course, all equal to 120 degrees.

Further, it will be sufficient for the depression 104 to have a closed figure when viewed form the substrate normal. That is, the figure of the depression 104 is not limited to an equilateral triangle or an equilateral hexagon. Other than these figures, the depression figure may be substantially an equilateral triangle, substantially an equilateral hexagon, and a polygon such as a quadrangle and a hexagon. Further, the depression figure may be a circle and an ellipse. The reason is as follows. As described above, a crystal growth plane having a {1, −1, 0, 1} plane orientation is spontaneously formed by the crystal growth of the second semiconductor layer 103, so that even when the depression 104 has, other than an equilateral triangle and an equilateral hexagon, a closed figure such as a polygon, a circle, and an ellipse, the defects 109 will collect in one area by virtue of the depression 104. As a result, the second semiconductor layer 103 has a reduced defect density. The depression 104 without the provision of the bottom face 108 may be formed.

Moreover, it will be sufficient that the depth and the width (length) of the depression 104 are determined at an appropriate time according to, for example, the crystal growth condition of the second semiconductor layer 103. For instance, when using MOVPE in the present embodiment, the depth of the depression 104 can be determined so as to fall in the range of from about 1 μm to about 3 μm and the width (length) of the bottom face 108 of the depression 104 can be determined so as to fall in the range of from about 5 μm to 20 μm. Further, the ratio of the depth to the width (length) of the depression 104 (depth:width) can be 1:from 2 to 3.

Further, the semiconductor device of the present embodiment may be constructed of first and second semiconductor layers comprising hexagonal crystal material other than GaN and $Al_{0.1}Ga_{0.9}N$. In the present embodiment, the description has been made in terms of semiconductor devices. However, the first and second semiconductor layers 102 and 103 of the present embodiment may be utilized intact as a semiconductor substrate. When making utilization of the first and second semiconductor layers 102 and 103 as a semiconductor substrate, if the sapphire substrate 101 is unnecessary, then the sapphire substrate 101 is removed by, for example, abrasion. Further, the present embodiment includes a construction as its alternation in which in place of the sapphire substrate 101, the substrate 101 of nitride semiconductor (e.g., GaN) is used.

Embodiment 2

Figure 7:
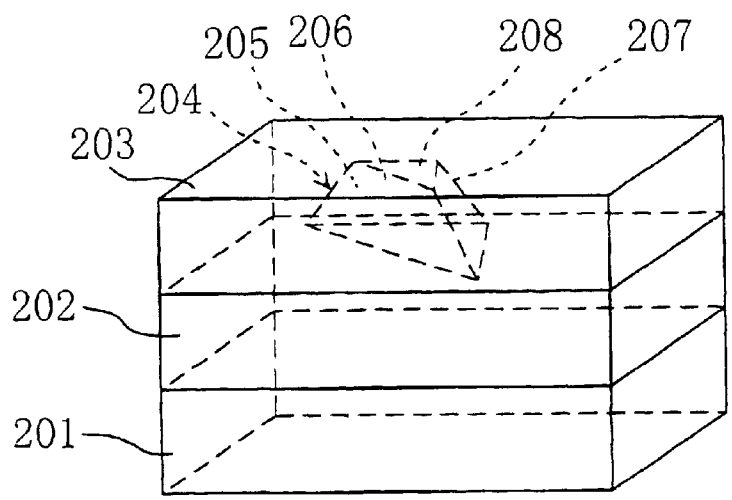
FIG. 7 is a diagram for the explanation of the structure of a semiconductor device according to a second embodiment of the present invention.

A second embodiment of the present invention will be now described by making reference to from FIG. 7 to FIGS. 9A–C. FIG. 7 schematically shows the structure of a semiconductor device according to the second embodiment. The semiconductor device of the second embodiment differs from the semiconductor device of the first embodiment in that the former has a substrate 202 on which surface is formed a projection 204 while on the other hand the latter has the substrate 102 in which surface is formed the depression 104. Hereinafter, for the sake of simplification, the description will be made mainly on points of the present embodiment different from the first embodiment and the same description as the first embodiment will be omitted or made in a simplified manner.

As shown in FIG. 7, the semiconductor device of the second embodiment has a first semiconductor layer 202 of hexagonal GaN with a thickness of 2.0 µm which is formed atop a sapphire substrate 201 and whose major surface is a (0, 0, 0, 1) plane and a second semiconductor layer 203 of $Al_{0.1}Ga_{0.9}N$ with a thickness of 1.5 µm which is formed atop the first semiconductor layer 202. Formed on the surface of the first semiconductor layer 202 is the projection 204 with a height of 0.5 µm. The figure of the projection 204 in the major surface of the first semiconductor layer 202 is an equilateral triangle the length of which sides is 1.0 µm. The projection 204 comprises three side faces 205, 206, and 207 having their respective plane orientations, i.e., (1, −1, 0, 1), (0, 1, −1, 1), and {−1, 0, 1, 1}. Located at a top face of the projection 204 is a plane having a plane orientation of (0, 0, 0.1). The second semiconductor layer 203 crystal grows from at least the side faces (205, 206, and 207) of the projection 204 and is formed overlying the first semiconductor layer 202. Like the first embodiment, a buffer layer (not shown in the figure) is formed between the The three angles of the triangle of the projection 204 in the major surface of the first semiconductor layer 202 are, of course, all equal to 60 degrees.

Like the first embodiment, also in the present embodiment, the second semiconductor layer 203 is formed by crystal growth from the three side faces 205, 206, and 207 of the projection 204. As a result, the second semiconductor layer 203 makes crystal growth in a direction different from a direction normal to the major surface of the first semiconductor layer 202, wherein defects are made to extend toward the outside of the projection 204. This therefore reduces the defect density of the second semiconductor layer 203 located above the three side faces 205, 206, and 207.

In the projection 204 of the present embodiment, the angle, formed of two line segments created by intersecting of two of the three side faces 205, 206, and 207 and a plane parallel to the major surface of the first semiconductor layer 202, is 60 degrees, which makes it possible to improve the crystallinity of the side faces 205, 206, and 207 so as to improve the crystallinity of the second semiconductor layer 203 that is formed thereon.

Next, by making reference to FIGS. 8A–C, a method for the manufacture of a semiconductor device of the present embodiment will be described below.

Figure 8A:
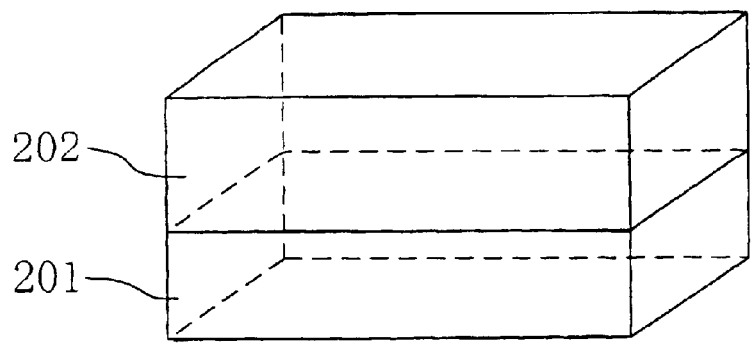
FIGS. 8A–C are views showing process steps for the explanation of a manufacture method according to the second embodiment.

In the first place, the first semiconductor layer 202 is grown on the sapphire substrate 201 by MOVPE (FIG. 8A).

Figure 8B:
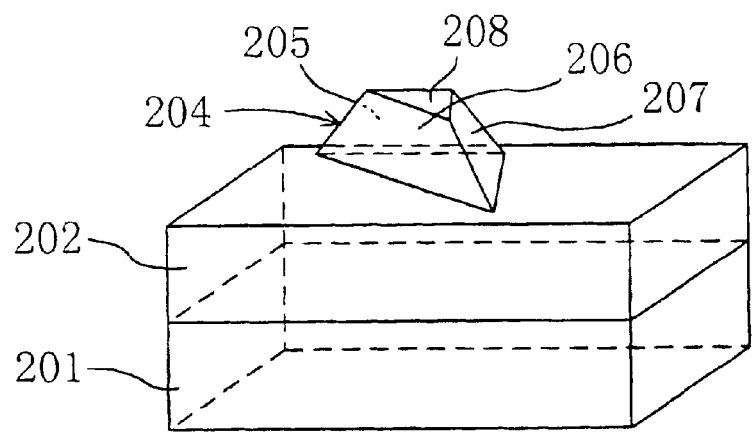

This is followed by application of a resist pattern (not shown in the figure) of equilateral triangle shape onto the first semiconductor layer 202, and dry etching using the resist pattern as a mask is carried out such that the thickness of an area of the first semiconductor layer 202 that are not covered with the mask is reduced (FIG. 8B). By the dry etching, the three side faces 205, 206, and 207 and the top face 208 are exposed.

Figure 8C:
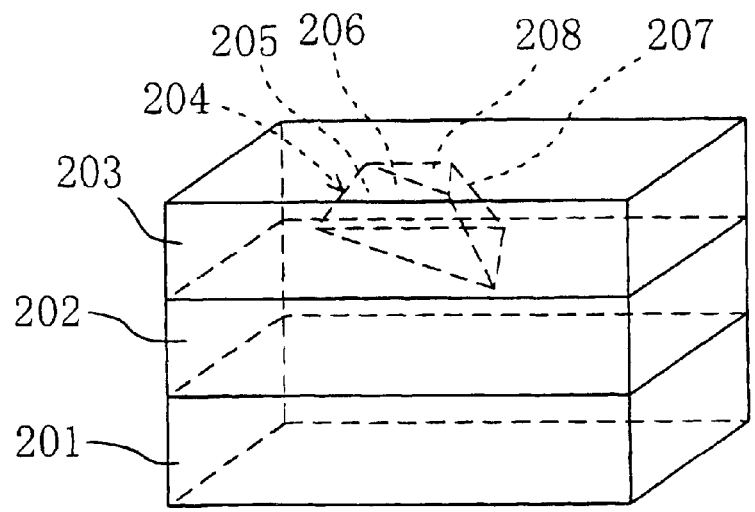

Thereafter, the resist pattern is removed and the second semiconductor layer 203 is grown on the first semiconductor layer 202 by MOVPE (FIG. 8C).

Figure 9A:
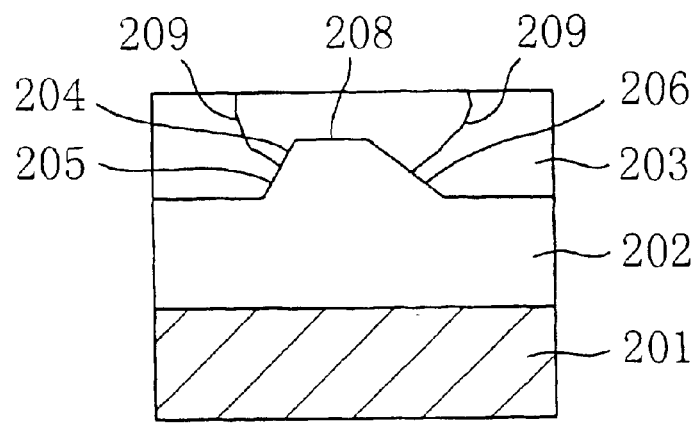
FIGS. 9A–C are cross-sectional views showing results obtained by observation of the cross sectional structure of semiconductor layers 202 and 203 by an electron microscope.
Figure 9B:
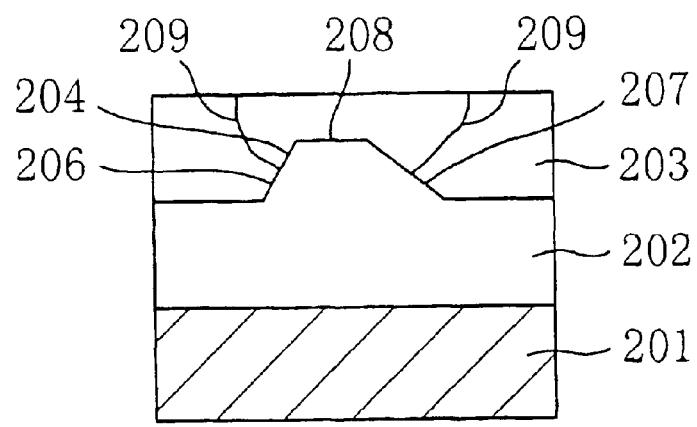
Figure 9C:
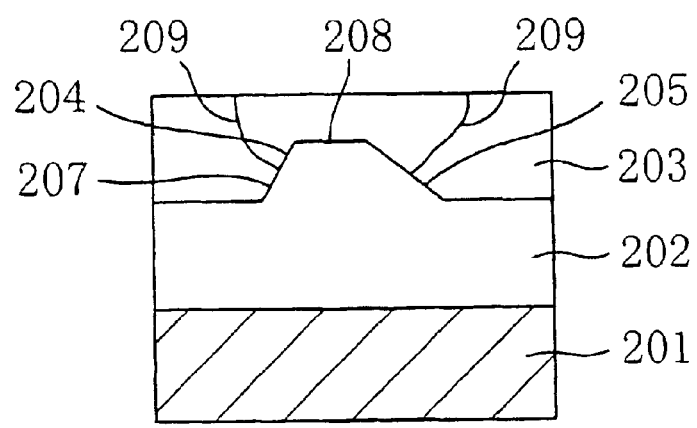

Cross sections of the first and second semiconductor layers 202 and 203 were observed by an electron microscope and the observation results are shown in FIGS. 9A–C. FIGS. 9A, 9B, and 9C show the manner of cross sections when cut along planes perpendicular to the major surface of the first semiconductor layer 202. In FIG. 9, no hatching is drawn for some layers for the sake of convenience.

The observation showed that in all of the cross sections of FIGS. 9A, 9B, and 9C, defects 209 extended beyond the outside of the side faces. Further, the surrounding surface of the projection 204 was observed by an optical microscope and the observation results showed that there was discovered no defect near substantially the center of the projection 204.

The observation results showed that the defects 209 in the second semiconductor layer 203 of the present embodiment extended beyond the outside of the side faces of the projection 204.

In the present embodiment, the figure of the projection 204 in the major surface of the first semiconductor layer 202 is not limited to an equilateral triangle. The projection figure may be a polygon such as a quadrangle and a hexagon. Further, the projection figure may be a circle or an ellipse. In view of improving the crystallinity of the side faces, it is preferable that the side faces be {1, −1, 0, 1} planes. However, for the same reason explained in the first embodiment, the side faces are not necessarily {1, −1, 0, 1} planes.

Further, the first and second semiconductor layers 202 and 203 may comprise hexagonal crystal material other than GaN and $Al_{0.1}Ga_{0.9}N$. Furthermore, the top face 208 of the projection 204 may be omitted.

Embodiment 3

Figure 10:
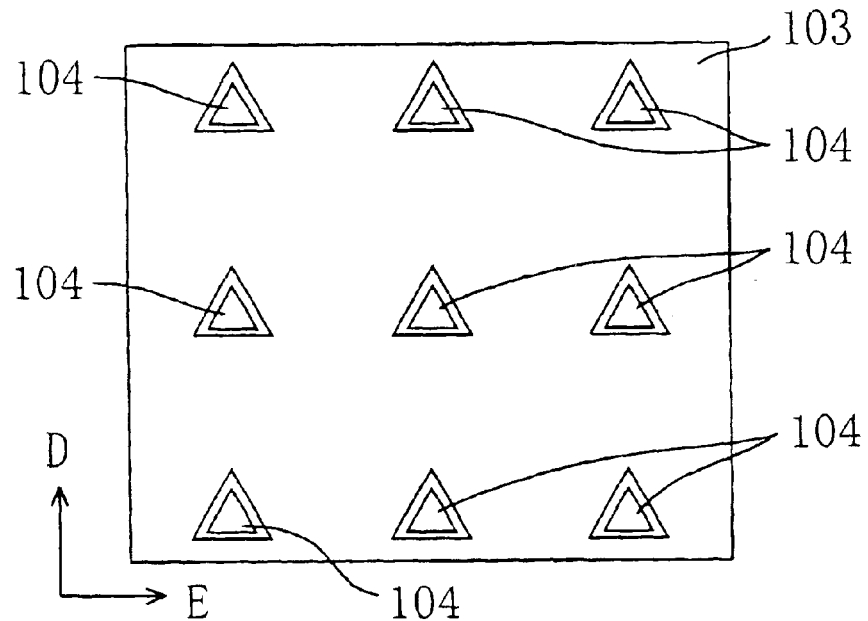
FIG. 10 is a top plan view for the explanation of the structure of a semiconductor device according to a third embodiment of the present invention.

A third embodiment of the present invention will be described with reference to FIG. 10. FIG. 10 schematically shows the upper surface structure of the semiconductor layer 103 included in a semiconductor device according to the third embodiment. The present embodiment differs from the first embodiment in that a plurality of the depressions 104 are formed. Hereinafter, for the sake of simplification, the description will be made mainly on points of the present embodiment different from the first embodiment and the same description as the first embodiment will be omitted or made in a simplified manner.

As shown in FIG. 10, the semiconductor device of the present embodiment has the first semiconductor layer 102 of GaN with a thickness of 2.0 µm which is formed on the sapphire substrate 101 and the second semiconductor layer 103 of $Al_{0.1}Ga_{0.9}N$ with a thickness of 1.0 µm which is formed on the first semiconductor layer 102. Formed in the first semiconductor layer 102 are a plurality of the depressions 104 with a depth of 1.0 µm. The plurality of the depressions 104 are formed and uniformly spaced apart in a <1, −1, 0, 0>direction (i.e., in a direction indicated by arrow D in the figure) and in a <1, 1, −2, 0>direction (i.e., in a direction indicated by arrow E in the figure) so that their center to center distance is 10 µm. Like the depression 104 of the first embodiment, the length of sides of the depression 104 of the present embodiment included in the major surface of the first semiconductor layer 102 is 1.5 μm and the depression 104 is defined by the three side faces 105, 106, and 107 having their respective plane orientations (i.e., {1, −1, 0, 1}, (0, 1, −1, 1), and (−1, 0, 1, 1,)) and the bottom face 108 having a (0, 0, 0, 1) plane orientation. The laminated structure in the vicinity of the depression is the same as FIG. 1. Further, formed between the sapphire substrate 101 and the first semiconductor layer 102 is a buffer layer (not shown in the figure).

In accordance with the present embodiment, since a plurality of the depressions 104 capable of directing defects toward the center of each of the depressions and causing the defects to collect in one area of each of the depressions are uniformly spaced apart, this more effectively reduces the defect density of the second semiconductor layer 103. In the present embodiment, the number of the depressions 104 is about $10^6$ per $cm^2$.

The manufacture method of the semiconductor device according to the present embodiment is almost the same as the first embodiment. The former, however, differs from the latter in that it uses, as a resist pattern for use in dry etching, a mask with openings of triangular shape which are uniformly spaced apart so that their center to center distance is 10 μm.

The semiconductor device according to the present embodiment was subjected to surface observation by an optical microscope and the results showed that there were found no particularly conspicuous defects other than ones that appeared in the form of a point in substantially the center of the depression 104. It was confirmed that the defect density was reduced in comparison with the conventional semiconductor devices.

Embodiment 4

Figure 11:
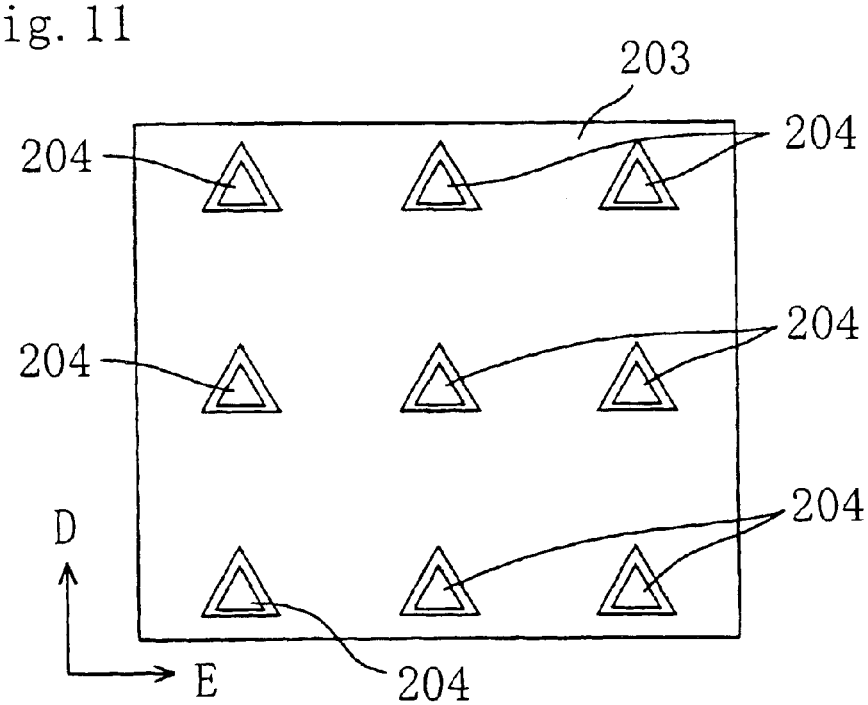
FIG. 11 is a top plan view for the explanation of the structure of a semiconductor device according to a fourth embodiment of the present invention.

A fourth embodiment of the present invention will be described by making reference to FIG. 11. FIG. 11 schematically shows the upper surface structure of the semiconductor layer 203 included in a semiconductor device according to the present embodiment. The present embodiment differs from the second embodiment in that a plurality of the projections 204 of the second embodiment are formed. Hereinafter, for the sake of simplification, the description will be made mainly on points of the present embodiment different from the second embodiment and the same description is omitted or made in a simplified manner.

As shown in FIG. 11, the semiconductor device of the present embodiment has the first semiconductor layer 202 of GaN with a thickness of 2.0 μm which is formed on the sapphire substrate 201 and the second semiconductor layer 203 of $Al_{0.9}Ga_{0.9}N$ with a thickness of 1.5 μm which is formed on the first semiconductor layer 202. Formed on the first semiconductor layer 202 are a plurality of the projections 204 with a height of 0.5 μm. The plurality of the projections 204 are formed and uniformly spaced apart in a <1, −1, 0, 0> direction (i.e., in a direction indicated by arrow D in the figure) and in a <1, 1, −2, 0> direction (i.e., in a direction indicated by arrow E in the figure) so that their center to center distance is 10 μm. Like the projection 204 of the second embodiment, the length of sides of the projection 204 included in the principal surface of the first semiconductor layer 202 is 1.0 μm and the projection 204 is defined by the three side faces 205, 206, and 207 having their respective plane orientations (i.e., (1, −1, 0, 1), (0, 1, −1, 1), and (−1, 0, 1, 1,)) and the top face 208 having a (0, 0, 0, 1) plane orientation. The laminated structure in the vicinity of the projection 204 is the same as FIG. 7. Further, formed between the sapphire substrate 201 and the first semiconductor layer 202 is a buffer layer (not shown in the figure).

In accordance with the present embodiment, since the plural projections 204 are uniformly spaced apart, so that defects are oriented toward between adjacent projections 204 and collected, thereby making it possible to reduce the defect density of the second semiconductor layer 203. In the present embodiment, the number of the projections 204 is about $10^6$ per $cm^2$.

The manufacture method of the semiconductor device according to the present embodiment is almost the same as the first embodiment but differs from the first embodiment in that the former uses, as a resist pattern for use in dry etching, a mask (a resist pattern) with openings of triangular shape which are uniformly spaced apart so that their center to center distance is 10 μm.

The semiconductor device according to the present embodiment was subjected to surface observation by an optical microscope and the results showed that there were found no particularly defects other than ones that sparsely appeared in the vicinity of substantially a mid-position between adjacent projections 204. It was confirmed that the defect density was reduced in comparison with the conventional semiconductor devices.

In the third and fourth embodiments, it will be sufficient that the appropriate length of the sides of the depression 104 or the projection 204 included in the major surface of the first semiconductor layer and their placement interval are selected according to, for example, the thickness of the first semiconductor layer 102 or 202. Moreover, the placement pattern of the depressions 104 or the projections 204 is not limited to an equal interval placement pattern. A desired placement pattern may be obtained by an appropriate setting.

Figure 12:
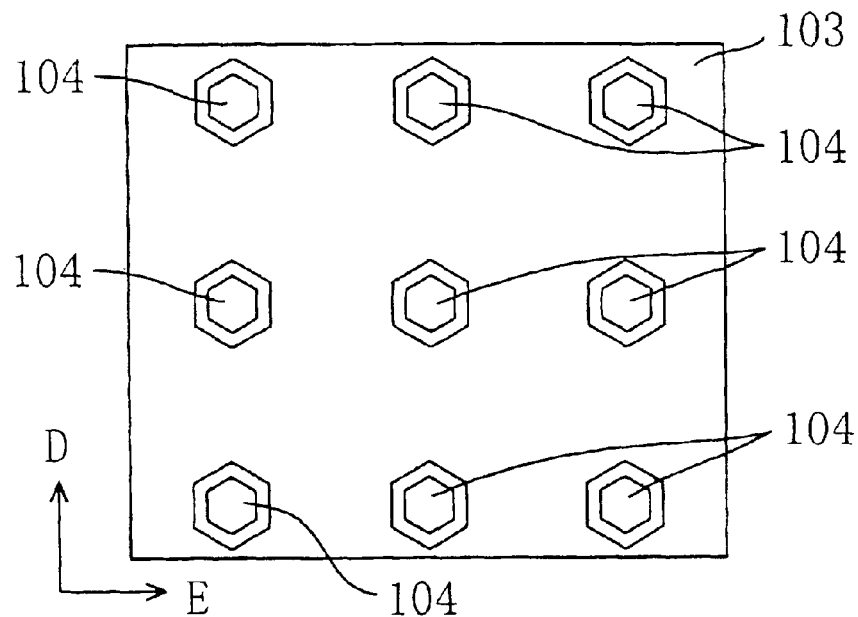
FIG. 12 is a top plan view showing an alternation example of the structure of the third embodiment.
Figure 13:
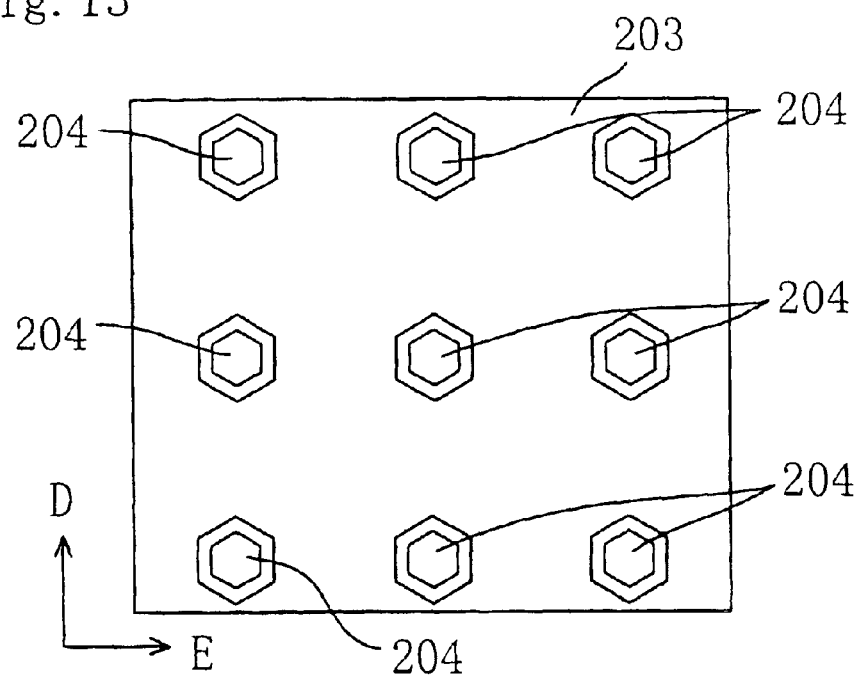
FIG. 13 is a top plan view showing an alternation example of the structure of the fourth embodiment.

Further, an arrangement may be made in which the figure of the depression 104 in the third embodiment is an equilateral hexagon (FIG. 12). Furthermore, an arrangement may be made in which the figure of the projection 204 is an equilateral hexagon (FIG. 13).

In each of the first to fourth embodiments, hexagonal substrates other than the sapphire substrate can be used as the substrate 101 or 201. For example, spinel substrates, SiC substrates, or GaN substrates may be used.

Further, in each of the first to fourth embodiments, instead of forming a depression or projection in the first semiconductor layer, a depression or projection may be formed in the substrate 101 or 201. This also enables formation of a depression or projection in the first semiconductor layer.

In the foregoing embodiments, a device having a lamination structure such as a semiconductor laser element may be formed in place of the second semiconductor layer. When such a device is formed, it is possible to improve the characteristics of the device by forming an active region in a region having a reduced defect density.

Further, in the foregoing embodiments, an arrangement may be made in which instead of forming a second semiconductor layer, a semiconductor laser element is formed and the stripe direction of the semiconductor laser element is aligned with the direction in which the depressions or projections are placed. As a result of such arrangement, defects in the stripe region can be reduced, thereby improving the characteristics of the semiconductor laser elements.

Embodiment 5

Figure 14:
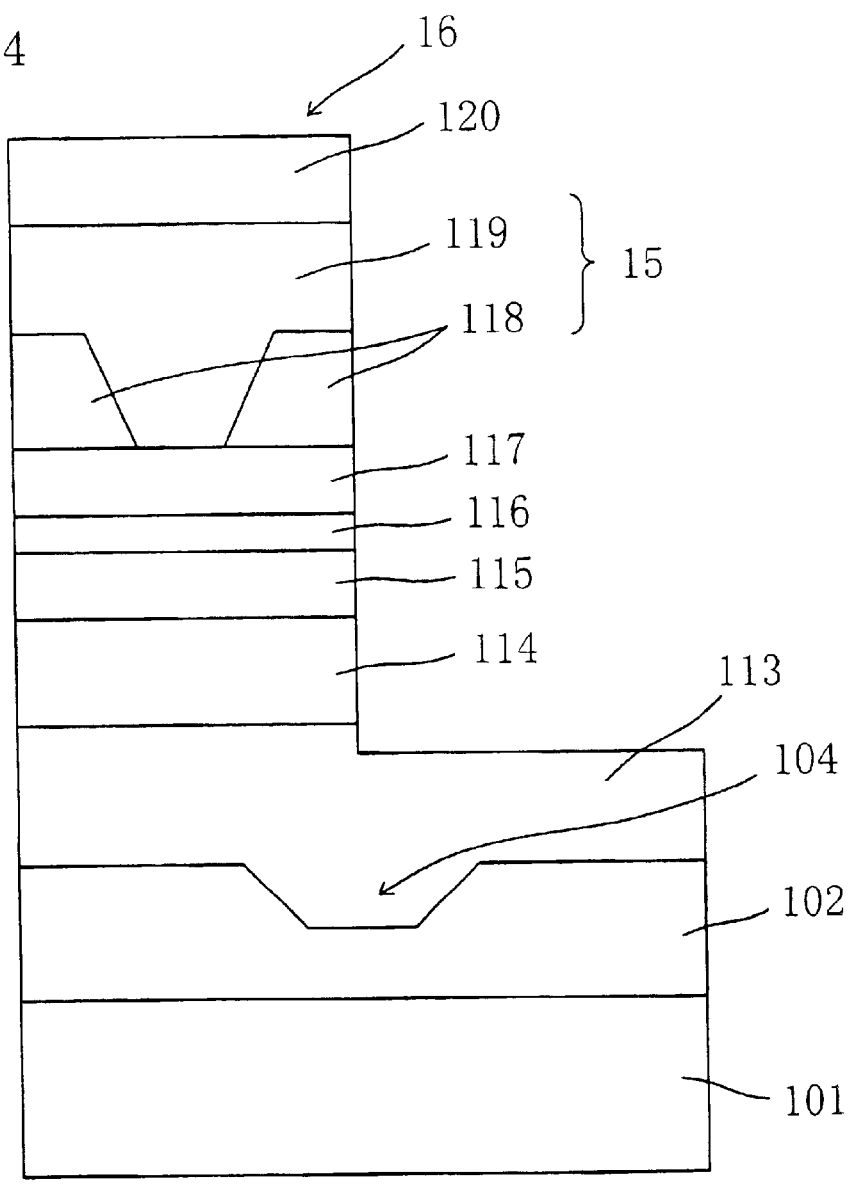
FIG. 14 is a cross-sectional view showing a semiconductor laser devise according to a fifth embodiment of the present invention.

Referring to FIG. 14, a fifth embodiment of the present invention will be described. FIG. 14 is a cross-sectional view schematically showing the structure of a semiconductor laser device according to the fifth embodiment. The present embodiment differs from the first embodiment in that a plurality of semiconductor layers (i.e., a semiconductor laser structure 16) including at least an active layer 116 are formed on the first semiconductor layer 102 having the depression 104 of the first embodiment. Hereinafter, for the sake of simplification, the description will be made mainly on points of the present embodiment different from the first embodiment and the same description as the first embodiment will be omitted or made in a simplified manner.

As shown in FIG. 14, the semiconductor device (the semiconductor laser device) of the present embodiment has the first semiconductor layer 102 formed on the sapphire subsrate 101 and the semiconductor laser structure 16 formed on the first semiconductor layer 102. The first semiconductor layer 102 is formed of hexagonal GaN and its major surface is a (0, 0, 0, 1) plane. The thickness of the first semiconductor layer 102 is 2.0 $\mu$m. Formed in the surface of the first semiconductor layer 102 is the depression 104 with a depth of about 1.0 $\mu$m. The depression 104 comprises six side faces having plane orientations of (1, −1, 0, 1), (0, 1, −1, 1), (1, 0, −1, 1), (−1, 1, 0, 1), (0, −1, 1, 1), and (−1, 0, 1, 1) respectively and a bottom face having a plane orientation of (0, 0, 0, 1), and the length of the sides of the depression 104 in the major surface of the first semiconductor layer 102 is 1.5 $\mu$m.

The semiconductor laser structure 16 has an n-type contact layer 113, an n-type clad layer 114, an n-type light guide layer 115, an active layer 116, a p-type light guide layer 117, a current block structure 15, and a p-type contact layer 120 which are sequentially formed over the first semiconductor layer 102 in that order. The current block structure 15 has a structure in which a p-type clad layer 119 is formed on an n-type current block layer 118 with an opening in the form of a stripe whose maximum width is 10 $\mu$m. The current block structure 15 is formed as follows. That is, the n-type current block layer 118 is first formed having a thickness of 500 nm. This is followed by provision of a mask with an opening in the form of a stripe the width of which is 10 $\mu$m. Then, dry etching is carried out to form a groove. The mask is removed. Thereafter, the p-type clad layer 119 having a thickness of at most 1.0 $\mu$m is formed such that the groove is filled with the p-type clad layer 119.

Further, the active layer 116 of the semiconductor laser structure 16 has a triple quantum well structure (total thickness: 29 nm) which is formed by alternating lamination of three well layers of $In_{0.2}Ga_{0.8}N$ (thickness: 3 nm) and four barrier layers of $In_{0.05}Ga_{0.95}N$ (thickness: 5 nm). Various conditions such as layer composition, layer thickness, and carrier density for the individual layers of the semiconductor laser structure 16 other than the active layer 116 are shown in the following Table 1.

TABLE 1

| LAYER TYPE | COMPOSITION | LAYER THICKNESS | CARRIER DENSITY |
|---|---|---|---|
| LAYER 113 | GaN | 2 $\mu$m | $5 \times 10^{18}$ cm$^{-3}$ |
| LAYER 114 | $Al_{0.1}Ga_{0.9}N$ | 500 nm | $1 \times 10^{18}$ cm$^{-3}$ |
| LAYER 115 | GaN | 100 nm | $1 \times 10^{18}$ cm$^{-3}$ |
| LAYER 118 | $Al_{0.2}Ga_{0.8}N$ | 500 nm | $1 \times 10^{18}$ cm$^{-3}$ |
| LAYER 119 | $Al_{0.1}Ga_{0.9}N$ | 1.0 $\mu$m | $1 \times 10^{18}$ cm$^{-3}$ |
| LAYER 120 | GaN | 500 nm | $5 \times 10^{18}$ cm$^{-3}$ |

In order to establish contact by forming an n-type electrode (not shown in the figure) on the n-type contact layer 113, the semiconductor laser structure 16 is removed partially from the p-type contact layer 120 to the n-type contact layer 113 by dry etching so that a part of the n-type contact layer 113 is exposed. Formed on the p-type contact layer 120 is a p-type electrode (not shown in the figure). The oscillation wavelength of the semiconductor laser device according to the present embodiment is 410 nm.

In the semiconductor laser device of the present embodiment, it is designed such that the semiconductor laser structure 16 is formed in a region having a reduced defect density by the depression 104. This enables the present embodiment to provide semiconductor laser devices with better characteristics (such as long life span and excellent laser output) in comparison with conventional semiconductor laser devices.

Figure 15:
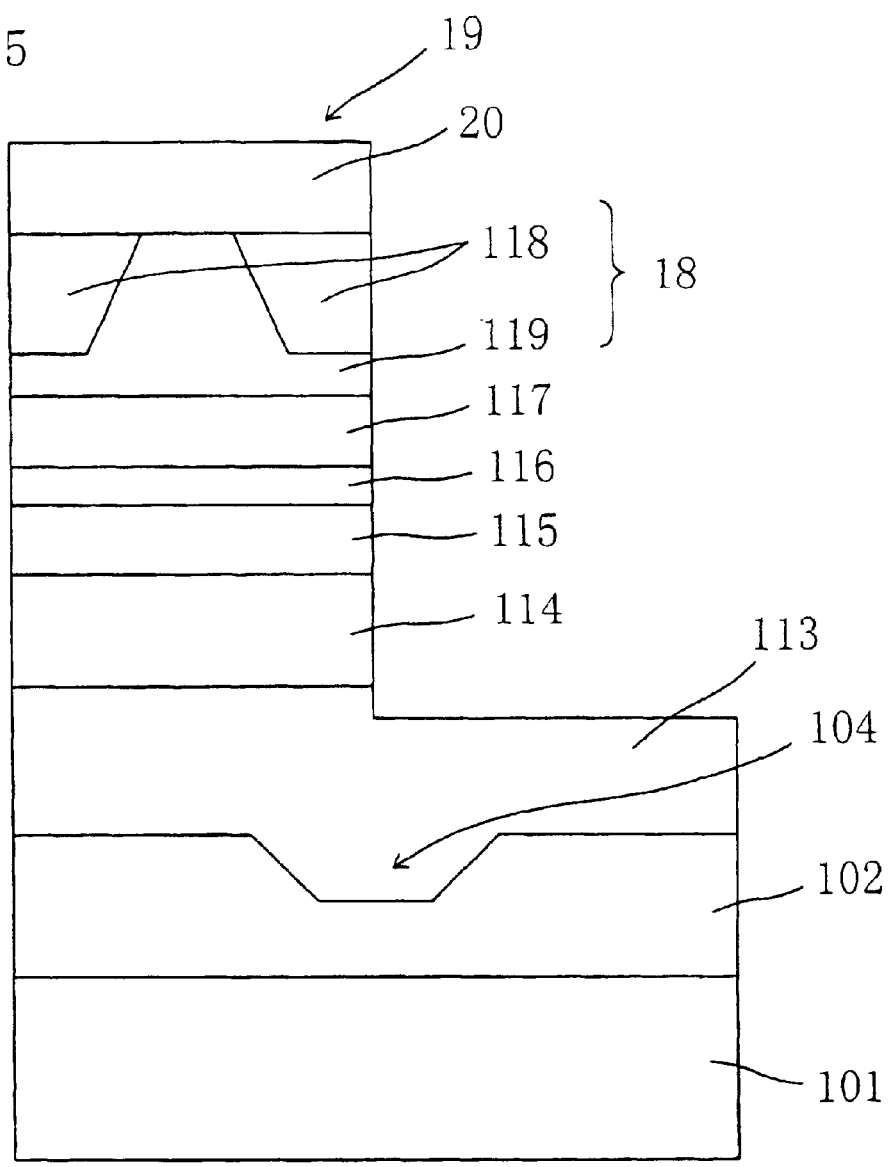
FIG. 15 is a cross-sectional view showing an alternation example of the semiconductor laser device of the fifth embodiment.

As shown in FIG. 15, a semiconductor laser device, in which instead of the semiconductor laser structure 16 of FIG. 14, a semiconductor laser structure 19 having a current block structure 18 is formed on the first semiconductor layer 102, is able to provide the same effects. The current block structure 18 is formed as follows. First, the p-type clad layer 119 is formed having a thickness of 0.8 $\mu$m. This is followed by provision of a stripe-like mask with a width of 10 $\mu$m and dry etching is carried out, wherein a part of the p-type clad layer 119 is left while the p-type clad layer 119 is removed until the thickness of the other part is reduced to 300 nm. This is followed by formation of the n-type current block layer 118 with a thickness of 500 nm. Thereafter, the mask is removed. The composition and the carrier density of the p-type clad layer 119 and the n-type current block layer 118 are the same as the p-type clad layer 119 and the n-type current block layer 118 in the semiconductor laser device of FIG. 14.

In the present embodiment, the same first semiconductor layer 102 as the first embodiment is used. However, the same first semiconductor layer 202 as the second embodiment may be used.

Embodiment 6

Figure 16A:
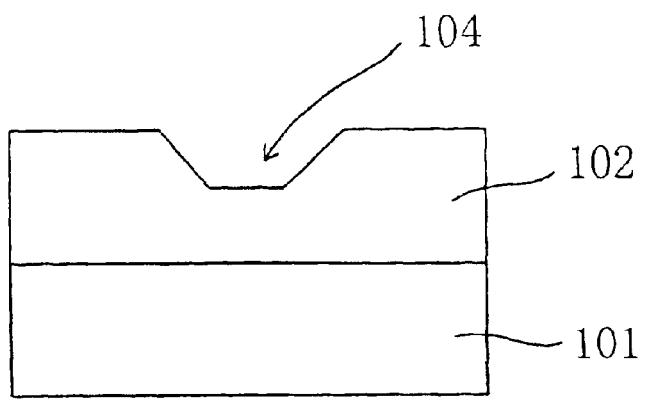
FIGS. 16A–C are cross-sectional views for the explanation of process steps of the manufacture of a semiconductor substrate according to a sixth embodiment of the present invention.
Figure 16B:
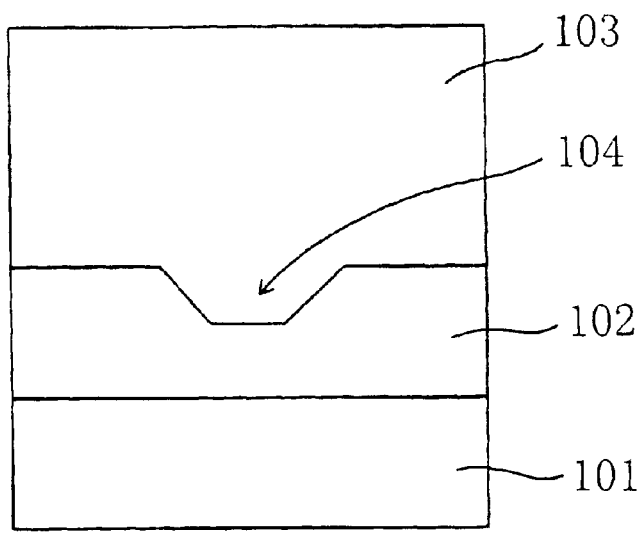
Figure 16C:
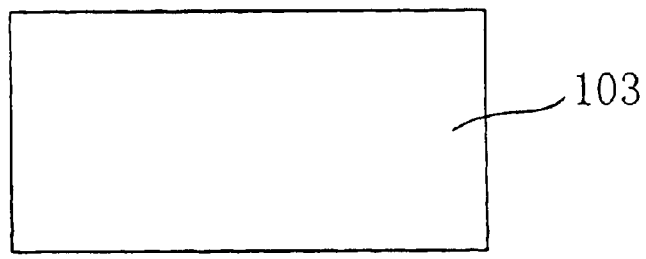

Referring to FIG. 16, a sixth embodiment of the present invention will be described. FIGS. 16A–C are cross-sectional views for the explanation of a method of manufacturing a semiconductor substrate according to the sixth embodiment. The present embodiment differs from the first embodiment in that after the second semiconductor layer 103 with a relatively great thickness is formed on the first semiconductor layer 102 having the depression 104 of the first embodiment, a semiconductor substrate comprising the second semiconductor layer 103 is obtained. Hereinafter, for the sake of simplification, the description will be made mainly on points of the present embodiment different from the first embodiment and the same description as the first embodiment will be omitted or made in a simplified manner.

As shown in FIG. 16A, in the same way as the first embodiment, the first semiconductor layer 102 of hexagonal GaN whose major surface is a (0, 0, 0, 1) plane with a thickness of 2.0 $\mu$m is formed on the sapphire substrate 101. Formed in the first semiconductor layer 102 is the depression 104 with a depth of about 1.0 $\mu$n. The depression 104 comprises six side faces having plane orientations of (1, −1, 0, 1), (0, 1, −1, 1), (1, 0, −1, 1), (−1, 1, 0, 1), (0, −1, 1, 1), and (−1, 0, 1, 1) respectively and a bottom face having a plane orientation of (0, 0, 0, 1), and the length of the sides of the depression 104 in the major surface of the first semiconductor layer 102 is 1.5 $\mu$m. Hereinafter, the sapphire substrate 102 with some layers formed thereon will be referred to simply as the substrate.

Next, as shown in FIG. 16B, the second semiconductor layer 103 of GaN is crystal grown on the first semiconductor layer 102 by HVPE (hydride vapor phase epitaxy). In the present embodiment, based on the bottom face of the depression 104, the thickness of the second semiconductor layer 103 is 300 μm. The HVPE conditions used in the present embodiment are shown in the following Table 2.

TABLE 2

| GROUP III SOURCE GAS | GaCl$_3$ (flow rate: 50 sccm) |
|---|---|
| GROUP V SOURCE GAS | NH$_3$ (flow rate: 5 slm) |
| CARRIER GAS | N$_2$ (flow rate: 10 slm) |
| PRESSURE | 1.013 × 10$^5$ Pa |
| SUBSTRATE TEMP. | 1000° C. |
| GROWTH VELOCITY | 50 μm/h |
| GROWTH TIME | 6 HOURS |

When the growth velocity is 50 μm per hour, the flow rate of Group III source gas (GaCl$_3$) is set at 50 sccm. If the growth velocity is 100 μm per hour, then it will be sufficient that the flow rate of Group III source gas (GaCl$_3$) is set at about 100 sccm. Further, not only N$_2$ but also H2 or N$_2$-H$_2$ mixture gas can be used as a carrier gas.

Thereafter, as shown in FIG. 16C, the sapphire substrate 101 is removed from the substrate for separation of the second semiconductor layer 103 and a semiconductor substrate of GaN (GaN substrate) is obtained. The sapphire substrate 101 is removed by, for example, abrasion.

In the manufacture method of the present embodiment, the second semiconductor layer (semiconductor substrate) 103 is formed on the first semiconductor layer 102 having the depression 104. This makes it possible to provide the second semiconductor layer (semiconductor substrate) 103 the defect density of which is further reduced when compared with the conventional techniques.

Figure 17:
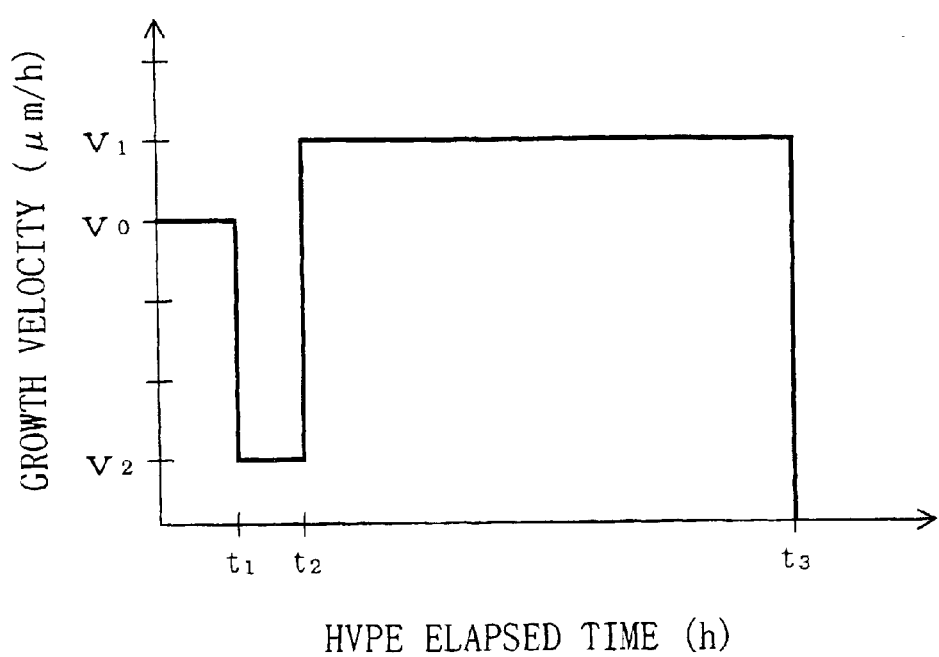
FIG. 17 graphically shows the crystal growth condition for the explanation of an alternation example of the semiconductor substrate manufacture method of the sixth embodiment.
Figure 18:
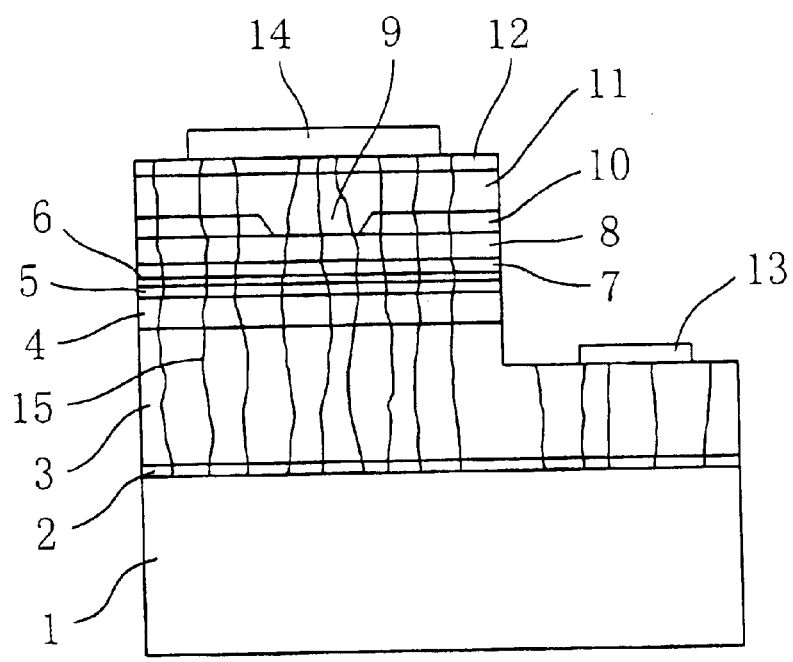
FIG. 18 shows in cross section a conventional semiconductor device.

Further, instead of using the conditions as shown in Table 2, it is possible to employ HVPE in which the growth velocity varies by time, as shown in FIG. 17, which will be described in detail. First, a semiconductor layer of GaN (GaN layer) is grown on the sapphire substrate 101 at a growth velocity of 40 μm per hour (v0), as a result of which a depression of hexagonal pyramid shape is spontaneously created in the top surface of the GaN layer. The inside faces of the hexagonal pyramid are planes having a plane orientation of {1, −1, 0, 1} which are surfaces on which the GaN layer crystal grows. So far, no clear reasons for why spontaneous creation of such a hexagonal pyramid-shaped depression occur have been found. However, such a depression is considered to be created spontaneously when crystal growth is carried out at a faster growth velocity than commonly-used growth velocities. Generally, the crystal growth velocity is considered to be determined under such conditions that no hexagonal pyramid-shaped depression is created. On the contrary, the present embodiment positively makes utilization of conditions capable of creation of a hexagonal pyramid-shaped depression.

If a GaN layer with a depression having {1, −1, 0, 1} inside faces is made to act as the first semiconductor layer 102 (see FIG. 16A) and the second semiconductor layer (GaN substrate) 103 is grown on the GaN layer, this makes it possible to provide a semiconductor layer (semiconductor substrate) having a reduced defect density by performing only hydride vapor phase epitaxy in which the growth velocity is appropriately varied by time, without the step of forming the depression 104 by dry etching. In the present embodiment, a hydride vapor phase epitaxy (HVPE) process is carried out in which conditions of t1=1 hour, t2=2 hours, and t3=12 hours are employed as the hydride vapor phase epitaxy elapsed time (h) and conditions of v0=40 μm/h, v1=50 μn/h, and v2=10 μm/h are employed as th growth velocity (μm/h) (FIG. 17). The crystal growth velocity when using HVPE may be chosen according to other various conditions. For instance, if the crystal growth velocity is above 0.5 μm/h but below 200 μm/h, then the crystallinity of the second semiconductor layer (GaN substrate) 103 can be maintained at good level. In the present embodiment, the same first semiconductor layer 102 as the first embodiment is used. However, the same first semiconductor layer 202 as the second embodiment may be used.

Further, in the present embodiment, in order to improve chemical wetting, the sapphire substrate 101 with a buffer layer formed thereon is employed. Instead, the sapphire substrate 101 without the provision of a buffer layer, whose chemical wetting is improved by ammonia atmosphere treatment or by gallium chloride treatment, may be employed. Further, when positively preparing a semiconductor layer (GaN layer) having in its top face a depression of hexagonal pyramid shape according to the manufacture method shown in FIG. 17, the sapphire substrate 101 without a buffer layer is used and use of a technique of choosing ideal crystal growth conditions for a semiconductor layer having in its top face a depression of hexagonal pyramid shape can be considered.

As described above, in accordance with the present invention, it is possible to cause defects to collect at a specified area in a semiconductor layer. This therefore provides a technique capable of reducing the defect density of semiconductor layers.

What is claimed is:

1. A method for the manufacture of a semiconductor device comprising:

a step of preparing a substrate in which, on a surface thereof, a depression is formed having a triangle or hexagonal figure when viewed from the substrate normal; and a step of forming on said surface of said substrate a semiconductor layer having a hexagonal crystal structure, whereby said depression is filled by said semiconductor layer, wherein said depression forming step is intentionally performed such that an inside face of said depression is defined by either a plane having a plane orientation of (1, −1, 0, n), where said number n is an arbitrary number other than 0, or its equivalent plane, and wherein defects in said semiconductor layer are concentrated in the direction of the center of said depression.

2. A method for the manufacture of a semiconductor device comprising:

a step of preparing a substrate;

a step of forming on a surface of said substrate a depression having a triangle or hexagonal figure when viewed from the substrate normal; and a step of forming on said surface of said substrate a semiconductor layer having a hexagonal crystal structure, whereby said depression is filled by said semiconductor layer, wherein said depression forming step is intentionally performed such that an inside face of said depression is defined by either a plane having a plane origination of (1, −1, 0, n), where said number n is an arbitrary number other than 0, or its equivalent plane, and wherein defects in said semiconductor layer are concentrated in the direction of the center of said depression.

3. The manufacture method of claim 2, wherein said depression forming step is performed such that an inside face of said depression is defined by either a plane having a plane orientation of (1, −1, 0, 1) or is equivalent plane.

4. The manufacture method of claim 3,
wherein said depression forming step is the step of forming on said surface of said substrate defined by a (0, 0, 0, 1) plane a depression having a bottom face whose figure is either an equilateral triangle or an equilateral hexagon.

5. The manufacture method of claim 1,
wherein said semiconductor layer forming step is the step of forming a semiconductor layer in which an inside face of said depression serves as a crystal growth surface.

6. The manufacture method of claim 5,
wherein said semiconductor layer forming step includes a step in which said semiconductor layer crystal grows in a vertical direction from said inside face of said depression.

7. The manufacture method of claim 2,
wherein said semiconductor layer forming step is the step of forming a semiconductor layer in which an inside face of said depression serves as a crystal growth surface.

8. The manufacture of claim 7,
wherein said semiconductor layer forming stop includes a step in which said semiconductor layer crystal grows in a vertical direction from said inside face of said depression.

9. The manufacture method of claim 1,
wherein said semiconductor layer forming step is the step of forming a layer which comprises Group III nitride-based compound semiconductor.

10. The manufacture method of claim 2,
wherein said semiconductor layer forming step is the step of forming a layer which comprises Group III nitride-based compound semiconductor.

11. The manufacture method of claim 9,
wherein said Group III nitride-based compound semiconductor layer is grown by a metal organic vapor epitaxy method.

12. The manufacture method of claim 10,
wherein said Group III nitride-based compound semiconductor layer is grown by a metal organic vapor epitaxy method.

13. The manufacture method of claim 2,
wherein said Group III nitride-based compound semiconductor layer is grown by a metal organic vapor epitaxy method.

14. A method for the manufacture of a semiconductor substrate including:
a step of preparing a substrate for crystal growth;
a step of depositing on said crystal growth substrate a first semiconductor layer having a hexagonal crystal structure;
a step of exposing either a plane having a plane orientation of $\{1, -1, 0, n\}$ where said number n is an arbitrary number, or its equivalent plane by subjecting a part of said first semiconductor layer to an etching process; and
after said exposing step, a step of depositing on said first semiconductor layer a second semiconductor layer having a hexagonal crystal structure, whereby said plane is covered with said second semiconductor layer and a depression is flatly filled by said second semiconductor layer,
wherein defects in said second semiconductor layer are concentrated in the direction of the center of said depression, and wherein said exposing step includes:
a step of applying onto said first semiconductor layer a resist pattern having an opening whose figure is either substantially an equilateral triangle, or substantially an equilateral hexagon when viewed from the substrate normal; and
a step of forming a depression by subjecting said first semiconductor layer to an etching process in which said resist pattern is used as a mask so that said depression has an inside face comprising either a plane having a plane orientation of (1, −1, 0, n) where said number n is an arbitrary number, or its equivalent plane.

15. The manufacture method of claim 14,
wherein said resist pattern has a plurality of said openings arrayed at equal intervals.

16. A method for the manufacture of a semiconductor substrate including:
a step of preparing a substrate for crystal growth;
a step of depositing on said crystal growth substrate a first semiconductor layer having a hexagonal crystal structure;
a step of exposing either a plane having a plane orientation of (1, −1, 0, n) where said number n is an arbitrary number, or its equivalent plane by subjecting a part of said first semiconductor layer to an etching process; and
after said exposing step, a step of depositing on said first semiconductor layer a second semiconductor layer having a hexagonal crystal structure, whereby said plane is covered with said second semiconductor layer and said projection is capped with said semiconductor layer,
wherein defects in said second semiconductor layer are radiated around said projection, and
wherein said exposing step includes:
a step of applying onto said first semiconductor layer a resist pattern whose figure is either substantially an equilateral triangle, or substantially an equilateral hexagon when viewed from the substrate normal; and
a step of forming a projection by subjecting said first semiconductor layer to an etching process in which said resist pattern is used as a mask so that said projection has a side face comprising either a plane having a plane orientation of (1, −1, 0, n) where said number n is an arbitrary number or its equivalent plane.

17. The manufacture method of claim 16,
wherein said resist pattern comprises a plurality of said resist patterns arrayed at equal intervals.

18. A method for the manufacture of a semiconductor substrate comprising:
a step of forming a substrate having on a surface thereof a depression having a triangle or hexagonal figure when viewed from the substrate normal;
a step of forming on said surface of said substrate a semiconductor layer having a hexagonal crystal structure, whereby said structure is filled by said semiconductor layer, and
a step of taking out said semiconductor layer by removal of said substrate,
wherein said depression has an inside face intentionally defined by either a plane having a plane orientation of (1, −1, 0, n), where said number n is an arbitrary number other than 0, or its equivalent plane, and
wherein defects in said semiconductor layer are concentrated in the direction of the center of said depression.

19. The manufacture method of claim 18,
wherein said depression has an inside face defined by either a plane having a plane orientation of (1, −1, 0, 1) or its equivalent plane.

20. The manufacture method of claim 19,
wherein said depression has in major surface of said substrate defined by a (0, 0, 0, 1) plane, a bottom face whose figure is either an equilateral triangle or an equilateral hexagon.

21. A method for the manufacture of a semiconductor substrate comprising:

a step of forming a substrate having on a surface thereof a triangle or hexagonal projection;

a step of forming on said surface of said substrate a semiconductor layer having a hexagonal crystal structure, whereby said projection is capped with said semiconductor layer; and a step of taking out said semiconductor layer by removal of said substrate, wherein said projection has a side face intentionally defined by either a plane having a plane orientation of (1, −1, 0, n), wherein said number n is an arbitrary number other than 0, or its equivalent plane, and wherein defects in said semiconductor layer are radiated around said projection.

22. The manufacture method of claim 21,
wherein said projection has a side face defined by either a plane having a plane orientation of (1, −1, 0, 1) or is equivalent plane.

23. The manufacture method of claim 21,
wherein said projection has, in said major surface of said substrate defined by a (0, 0, 0, 1) plane, a bottom face whose figure is either an equilateral triangle or an equilateral hexagon.

24. The manufacture method of claim 18,
wherein said semiconductor layer forming step is the step of forming a layer of Group III nitride-based compound semiconductor.

25. The manufacture method of claim 21,
wherein said semiconductor layer forming step is the step of forming a layer of group III nitride-based compound semiconductor.

26. The manufacture method of claim 24,
wherein said Group III nitride-based compound semiconductor layer is grown by hydride vapor phase epitaxy.

27. The manufacture method of claim 25,
wherein said Group III nitride-based compound semiconductor layer is grown by hydride vapor phase epitaxy.

28. The manufacture method of claim 18,
said substrate forming step including:

a step of preparing a sapphire substrate; and a step of forming on said sapphire substrate a group III nitride-based compound semiconductor layer having said depression in a surface thereon.

29. The manufacture method of claim 21,
said substrate forming step including:

a step of preparing a sapphire substrate; and a step of forming on said sapphire substrate a group III nitride-based compound semiconductor layer having said projection on a surface thereof.

* * * * *

UNITED STATES PATENT AND TRADEMARK OFFICE
CERTIFICATE OF CORRECTION

PATENT NO. : 6,821,805 B1
DATED : November 23, 2004
INVENTOR(S) : Shinji Nakamura et al.

It is certified that error appears in the above-identified patent and that said Letters Patent is hereby corrected as shown below:

Column 18,
Line 67, "is" should read -- its --

Column 19,
Line 54, "{1, -1, 0, n}" should read -- ( 1, -1, 0, n) --

Column 22,
Lines 22 and 28, "group" should read -- Group --

Signed and Sealed this

Third Day of May, 2005

JON W. DUDAS
*Director of the United States Patent and Trademark Office*